(12) United States Patent
Fruend et al.

(10) Patent No.: US 11,268,772 B2
(45) Date of Patent: Mar. 8, 2022

(54) HEAT TRANSFER DEVICE

(71) Applicant: Aptiv Technologies Limited, St. Michael (BB)

(72) Inventors: Marcel Fruend, Remscheid (DE); Jakub Korta, Cracow (PL)

(73) Assignee: Aptiv Technologies Limited, St. Michael (BB)

( * ) Notice: Subject to any disclaimer, the term of this patent is extended or adjusted under 35 U.S.C. 154(b) by 131 days.

(21) Appl. No.: 16/288,703

(22) Filed: Feb. 28, 2019

(65) Prior Publication Data
US 2019/0285372 A1  Sep. 19, 2019

(30) Foreign Application Priority Data
Mar. 15, 2018  (EP) .................................. 18162026

(51) Int. Cl.
*F28F 21/02* (2006.01)
*H01L 23/367* (2006.01)
*H01L 23/373* (2006.01)

(52) U.S. Cl.
CPC .......... *F28F 21/02* (2013.01); *H01L 23/3675* (2013.01); *H01L 23/373* (2013.01); *H01L 23/3735* (2013.01); *H01L 23/3736* (2013.01)

(58) Field of Classification Search
CPC .... F28F 21/02; H01L 23/373; H01L 23/3675; H01L 23/3735; H01L 23/3736; H01L 23/4334
See application file for complete search history.

(56) References Cited

U.S. PATENT DOCUMENTS

| | | | | |
|---|---|---|---|---|
| 5,542,471 A | * | 8/1996 | Dickinson | F28D 9/0062 165/170 |
| 6,131,651 A | * | 10/2000 | Richey, III | F28F 13/00 165/185 |
| 6,257,328 B1 | * | 7/2001 | Fujiwara | F28F 13/00 165/185 |
| 6,555,223 B2 | * | 4/2003 | Kubo | B32B 9/04 428/408 |
| 6,982,874 B2 | * | 1/2006 | Smalc | G06F 1/182 361/704 |
| 7,539,019 B2 | * | 5/2009 | Wayman | H01L 23/3677 165/185 |

(Continued)

FOREIGN PATENT DOCUMENTS

CN  202 443 965 U  9/2012
CN  206 923 216 U  1/2018
(Continued)

OTHER PUBLICATIONS

"Foreign Notice of Allowance", EP Application No. 18162026.1, dated Dec. 14, 2021, 5 pages.

(Continued)

*Primary Examiner* — Tho V Duong
(74) *Attorney, Agent, or Firm* — Sawtooth Patent Group PLLC

(57) ABSTRACT

The present invention relates to a heat transfer device, the heat transfer device includes a first plate like structure, and a second plate like structure, with the second plate like structure projecting from the first plate like structure, wherein both the second plate like structure and the first plate like structure each comprise one or more layers of graphite.

20 Claims, 3 Drawing Sheets

(56) References Cited

U.S. PATENT DOCUMENTS

| | | | |
|---|---|---|---|
| 7,889,502 B1* | 2/2011 | Reis | H05K 7/205 |
| | | | 361/717 |
| 8,235,094 B2* | 8/2012 | Wayman | H01L 23/367 |
| | | | 165/80.3 |
| 10,234,915 B2* | 3/2019 | Sun | B32B 37/14 |
| 2002/0141933 A1 | 10/2002 | Kubo | |
| 2006/0266496 A1 | 11/2006 | Edward et al. | |
| 2009/0032234 A1 | 2/2009 | Wayman et al. | |
| 2011/0056671 A1* | 3/2011 | Moon | H01L 23/36 |
| | | | 165/185 |

FOREIGN PATENT DOCUMENTS

| | | |
|---|---|---|
| EP | 2 738 804 A2 | 6/2014 |
| JP | 2007 067007 A | 3/2007 |
| JP | 2009 099878 A | 5/2009 |

OTHER PUBLICATIONS

"Foreign Office Action", CN Application No. 201910192575.0, dated Dec. 30, 2021, 22 pages.

\* cited by examiner

HEAT TRANSFER DEVICE

TECHNICAL FIELD OF INVENTION

This disclosure generally relates to a heat transfer device.

BACKGROUND OF INVENTION

Contemporarily, the computer body electronics thermal management is performed by passive (if existing heat fluxes are of lower values) or active methods (for higher heat fluxes). The advantage of the former over the latter is, that the passive systems do not need an external power source to operate and, due to absence of movable components, are less prone to malfunction. For this reason, this class of thermal management systems is preferable in the automotive design.

Heat transfer in any cooling system is based on three physical phenomena, namely: conduction, convection and radiation. In a standard body electronics passive cooling system, heat is transferred from a source and dissipated to the ambient through a thermal path consisting of thermal interface material, by e.g. a housing and, if possible, a radiating surface, in order to increase heat dissipation efficiency. The latter can be either housing/bracket surface or a housing with an attached radiator enhancing natural convection and radiation processes.

In order to allow heat to flow from a source to radiating surfaces, a contact is maintained between heat sources and a housing, which can be achieved by using the so-called pedestals, i.e. elements of the housing which remain in direct contact with heat sources. This technology allows for relatively efficient removal of heat out of body electronics by conduction. Heat conduction rate $\dot{Q}$ [W] can be described by the following eq. 1 and eq. 2:

$$\dot{Q} = -\frac{\Delta T}{R_\theta} \quad (1)$$

$$R_\theta = \frac{\Delta x}{kA} \quad (2)$$

where $\Delta T$ [K] is the temperature difference between a source and dissipating surface and $$R_\theta = \left[\frac{K}{W}\right]$$

denotes thermal resistance. Heat conductivity of a material is denoted as $$k\left[\frac{W}{m-K}\right].$$

The substrate's length and cross-section surface area are $\Delta x$[m] and A[m$^2$], respectively.

However, the heat flow rate is limited by the heat conductivity of a material of the housing. Utilization of high thermally conductive materials for the housing can also be economically unacceptable. For this reason, separate components can be used locally, to transfer the heat out of the electronics, through the housing and to dissipate it to the ambient afterwards.

SUMMARY OF THE INVENTION

In view of the above it is an object of the present invention to make available a heat transfer device for electronic components, in particular used in vehicles, by means of which the efficiency of the heat transfer is increased with respect to the prior art.

Described herein is a heat transfer device, such as a heat sink, the heat transfer device comprising a first plate like structure, and a second plate like structure, with the second plate like structure projecting from the first plate like structure.

Such a heat transfer device comprises a first plate like structure, and a second plate like structure, with the second plate like structure projecting from the first plate like structure, wherein both the second plate like structure and the first plate like structure each comprise one or more layers of graphite.

The use of a heat transfer device comprising one or more layers of graphite in different parts of the structure of the heat transfer device improves the thermal conductivity in such cooling devices. This is because graphite has a high thermal stability and its thermal conductivity facilitate its use in high temperature heat transfer applications.

Moreover, such a device can be manufactured comparatively simple as it, on the one hand, has a fairly simple structure permitting the bulk production of such components and, on the other hand, does not require any moving parts which are demanding in effort and cost in their assembly.

It is preferred if the second plate like structure projects perpendicular from or at least substantially perpendicular from the first plate like structure. Additionally or alternatively the second plate like structure projects from the first plate like structure via an arc. Such a structure ensures an efficient cooling of e.g. a heat source arranged directly adjacent, preferably in parallel to the first plate like structure.

Advantageously at least one of the one or more layers of graphite of the first plate like structure is in, in particular direct, contact with at least one of the one or more layers of graphite of the second plate like structure. By having the first and second plate like structures contact one another a direct transfer of heat is effected between the two plate like structures increasing the efficiency of cooling of the heat transfer device.

Preferably at least one of the first plate like structure and the second plate like structure comprise a thermally conducting support layer, in particular a metal layer, preferably wherein the first plate like structure and the second plate like structure each comprise a thermally conducting support layer, in particular a metal layer. Such a thermally conducting support layer, in particular a metal layer can help conduct the temperature of the heat source towards the layer of graphite and also advantageously at the same time forms a support for the layer of graphite Advantageously the heat transfer device further comprises, in particular longitudinal, projections that extend from at least one of the one or more sides of one of the thermally conducting support layers and that are in particular directly connected to said metal layer and/or are bonded to the thermally conducting support layer. The provision of such thermal vias improves the conductance of the heat into the respective layer of graphite such that this can be transported more efficiently away from the respective heat source.

It is preferred if the projections are formed from the same material as the respective thermally conducting support layer. Thereby these can be formed in e.g. one piece and ensure a good conductance of the heat to the layer of graphite.

Preferably at least some of the projections are arranged in a respective array at the respective thermally conducting support layer, preferably wherein rows of projections of the array are spaced apart at least substantially equal to one another and/or the projections within a row are spaced apart at least substantially equal to one another. This provides an advantageous design with regard to the heat transfer which is comparatively simple to manufacture.

Preferably the projections are only arranged over a part of the respective side of the thermally conducting support layer. In this way, the part of the thermally conducting support layer from which the heat has to be transported faster can be provided with the projections whereas components which do not require an as efficient heat transfer can be formed without projections.

It is advantageous if at least some of the projections are solid projections, in particular solid cylindrical projections. These are simple to manufacture and are less likely to induce stresses into the respective layer of graphite in comparison to e.g. rectangular projections.

It is preferred if at least some of the projections project into and optionally through a respective one of the one or more layers of graphite. Thereby the heat can be distributed evenly throughout the height of the respective layer of graphite.

Advantageously a length of the projections corresponds to at least 50% of a layer thickness of the layer of graphite, in particular to at least 70% of a layer thickness of the layer of graphite, preferably to at least 85% of the layer of graphite and especially of at least substantially 100% of the layer of graphite. Projections of such size ensure a good thermal conductance into the layer of graphite and also an improved adhesion of the layer of graphite to the thermally conducting support layer.

In this connection it should be noted that it is preferable if a ratio of height to length of the projections is selected in the range of 1:5 to 100:1, especially in the range of 1:2 to 10:1. Such ratios improve the thermal conduction between the heat source and the layer of graphite.

Preferably at least one of the first plate like structure and the second plate like structure is a multi-layered structure comprising at least one layer of graphite and one thermally conducting support layer and optionally two layers of graphite arranged at either side of the thermally conducting support layer, optionally with projections projecting from one or both sides of the thermally conducting support layer into and preferably through the respective layer of graphite.

Advantageously a material of the thermally conducting support layer is a metal layer and is preferably selected from the group of members consisting of aluminum, copper, gold, silver, aluminum alloys, copper alloys, gold alloys, silver alloys and combinations of the foregoing. Such metals and metal alloys have thermal conductor properties that are beneficial from a cost perspective and can be molded to have a desired shape in an expedient manner.

Preferably each thermally conducting support layer has a respective plurality of projections projecting from oppositely disposed sides of the thermally conducting support layer, in particular the metal layer, with the oppositely disposed sides preferably being the sides of the thermally conducting support layer having the largest surface area.

The first plate like structure and the second plate like structure each have a length, a width and a height, advantageous ratios of size of these components are selected such that: a width of the second plate like structure corresponds to at least 70%, preferably at least 80%, most preferably at least 90% and especially to at least substantially 100% of the width of the first plate like structure; and/or a height of the second plate like structure corresponds to at least 70%, preferably at least 80%, most preferably at least 90%, especially to at least substantially 100% and in particular to less than 120% of the height of the first plate like structure; and/or a length of the second plate like structure corresponds to at least 70%, preferably at least 80%, most preferably at least 90%, especially to at least substantially 100%, and in particular to less than 150% of the length of the first plate like structure; and/or such that the second plate like structure is arranged to project from the first plate like structure within a range of 40 to 60%, preferably of 45 to 55%, most preferably of 48 to 52%, especially of at least substantially 50% of the length of the first plate like structure and over at least some of the width of the first plate like structure.

Expressed in numerical values it is advantageous if a height of the at least one of the first plate like structure and the second plate like structure is selected in the range of 0.5 to 20 mm, preferably in the range of 0.8 to 10 mm; and/or a width of the at least one of the first plate like structure and the second plate like structure is selected in the range of 3 to 100 mm, preferably in the range of 10 to 50 mm; and/or a length of the at least one of the first plate like structure and the second plate like structure is selected in the range of 3 to 100 mm, preferably in the range of 10 to 50 mm; and/or a thickness of a respective one of the layers of graphite is selected in the range of 0.5 to 10 mm, preferably in the range of 0.8 to 5 mm, and/or a thickness of a respective one of the thermally conducting support layers is selected in the range of 0.5 to 10 mm, preferably in the range of 0.8 to 5 mm.

Advantageously the heat transfer device is a passive heat transfer device; and/or wherein the heat transfer device is a heat sink; and/or the heat transfer device is an automotive heat transfer device that is configured to be used in a vehicle for cooling electronic components of a vehicle; and/or the heat transfer device further comprises one or more radiators that are preferably arranged at the second plate like structure.

It is preferred if the heat transfer device is at least substantially T-shaped, at least in a cross-section of the heat transfer device, optionally wherein the first plate like structure forms a horizontal bar of the T-shaped heat transfer device and the second plate like structure forms a vertical bar of the T-shaped heat transfer device.

Optionally the heat transfer device can also be at least substantially L-shaped, at least in a cross-section of the heat transfer device, optionally wherein the first plate like structure forms a horizontal bar of the L-shaped heat transfer device and the second plate like structure forms a vertical bar of the L-shaped heat transfer device. The skilled person will select the precise design of the heat transfer device in dependence on the construction space available and the component to be cooled.

Preferably the first plate like structure is configured to be arranged directly adjacent to a heat source, wherein the heat source is preferably in the form of an electronic component, such as an integrated circuit e.g. a microprocessor, a memory component, e.g. a RAM memory, a semiconductor component, e.g. a MOSFET or the like. Arranging the heat transfer device directly at the heat source ensures the most efficient removal of heat. The above components indicate components used e.g. in on board vehicle electronics that can generate heat and consequently need cooling.

Further features and advantages will appear more clearly on a reading of the following detailed description of the preferred embodiment, which is given by way of non-limiting example only and with reference to the accompanying drawings.

BRIEF DESCRIPTION OF DRAWINGS

Further embodiments of the invention are described in the following description of the Figures. The invention will be explained in the following in detail by means of embodiments and with reference to the drawing in which is shown.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
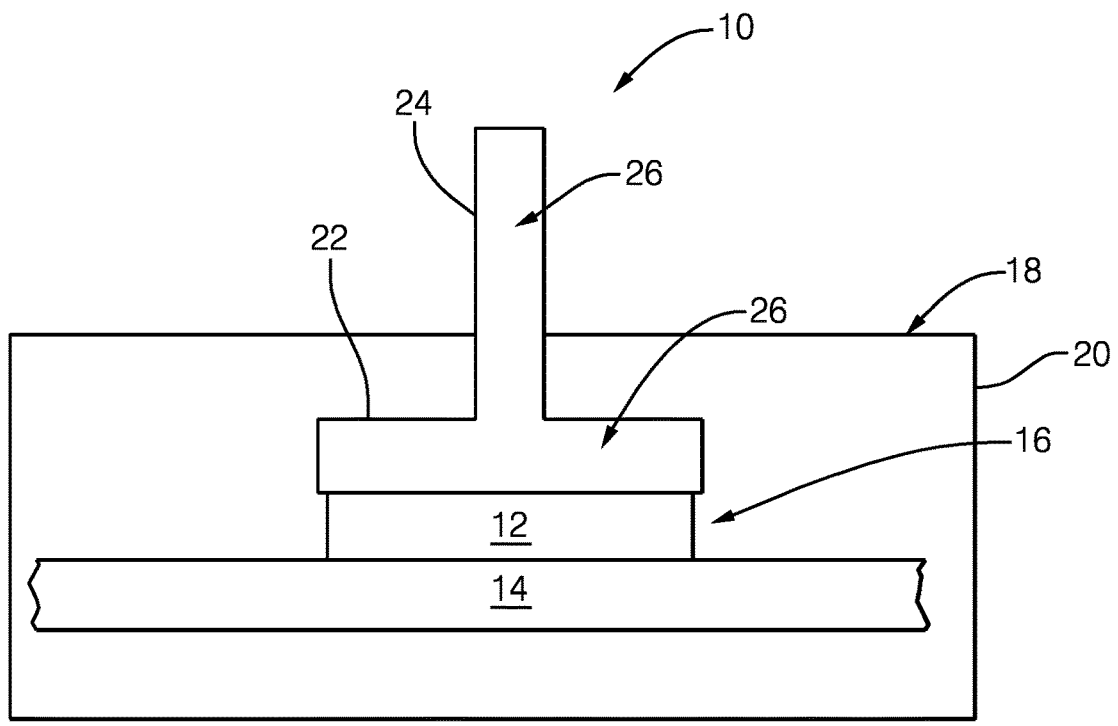
FIG. 1 is a schematic side view of a heat transfer device connected to a heat source present at an electronic circuit board.

FIG. 1 shows a schematic side view of a heat transfer device 10. The heat transfer device 10 is arranged directly adjacent to a heat source 12 arranged at a printed circuit board 14. This means it is arranged such that a largest free surface of the heat source 12 is covered by the heat transfer device 10, to ensure an effective cooling of the heat source 12.

In the present instance, the heat source 12 is a microcontroller 16 of an onboard communication system 18 of an automobile (not shown). A housing 20 of the onboard communication system 18 is also indicated.

The housing 20 can be designed to house the heat transfer device 10, the heat source 12 and the printed circuit board 14. Alternatively, as shown in FIG. 1, the second plate like structure 24 can project from the housing 20, in order to increase the radiation of heat from the heat transfer device 10.

The heat transfer device 10 comprises a first plate like structure 22, and a second plate like structure 24, with the second plate like structure 24 projecting perpendicular from the first plate like structure 22. In the example of FIG. 1 both the second plate like structure 24 and the first plate like structure 22 are each formed by a layer of graphite 26.

The layer of graphite 26 forming the first plate like structure is 22 in direct contact with the layer of graphite 26 forming the second plate like structure 24. Graphite is used as a material of the first and second plate like structures as this has a high thermal stability and its thermal conductivity facilitate its use in high temperature heat transfer applications.

The heat transfer device 10 is at least substantially T-shaped, at least in a cross-section of the heat transfer device 10, with the first plate like structure 22 forming a horizontal bar of the T-shaped heat transfer device 10 and the second plate like structure 24 forming a vertical bar of the T-shaped heat transfer device 10.

The heat transfer device 10 could also be formed at least substantially L-shaped (not shown), at least in a cross-section of the heat transfer device 10. In this case the first plate like structure 22 forms a horizontal bar of the L-shaped heat transfer device 10 and the second plate like structure 24 forms a vertical bar of the L-shaped heat transfer device.

Regardless of the precise design of the heat transfer device 10, the second plate like structure 24 can project directly from the first plate like structure 22, e.g. via a right angle or via an arc.

The microcontroller 16 mentioned above is only an example of a heat source 12 and naturally speaking different types of heat source 12 and hence also different types of applications can be cooled using the heat transfer device 10 discussed herein.

In the example shown, the first plate like structure 22 is configured to be arranged directly adjacent to the heat source 12. The heat source 12 can be selected from the group of members consisting of an electronic component, such as an integrated circuit e.g. a microprocessor, a memory component, e.g. a RAM memory, a semiconductor component, e.g. a MOSFET or the like.

Figure 2:
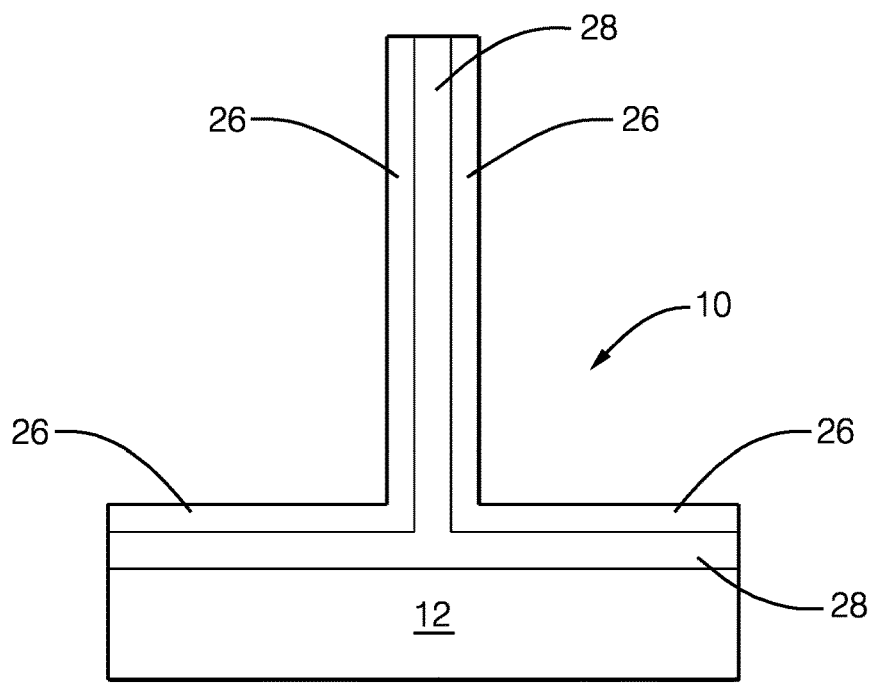
FIG. 2 is a schematic side view of a further embodiment of the heat transfer device.

FIG. 2 shows a schematic side view of a further heat transfer device 10. The first plate like structure 22 and the second plate like structure 24 each comprise a thermally conducting support layer 28. In the present example the thermally conducting support layer 28 is a metal layer 28. Other thermally conductive materials can also be selected as a material of the thermally conducting support layer 28.

The respective metal layer 28 can be formed from aluminum, copper, silver, gold, an aluminum alloy, a copper alloy, a silver alloy, a gold alloy or combinations of the foregoing. Such metal layers 28 have thermal conduction properties suitable for cooling functions, and are comparatively cheap. Other kinds of metals or metal alloys could also be used.

In addition to positively influencing the cooling properties of the heat transfer device 10, the metal layer 28 also supports the respective layer of graphite 26.

The metal layer 28 provided at the first plate like structure 22 is arranged between the layer of graphite 26 and the heat source 12. The first plate like structure 22 is thus a double layered structure.

The metal layer 28 provided at the second plate like structure 24 is sandwiched between two layers of graphite 26. The second plate like structure 24 is thus a triple layered structure.

Figure 3:
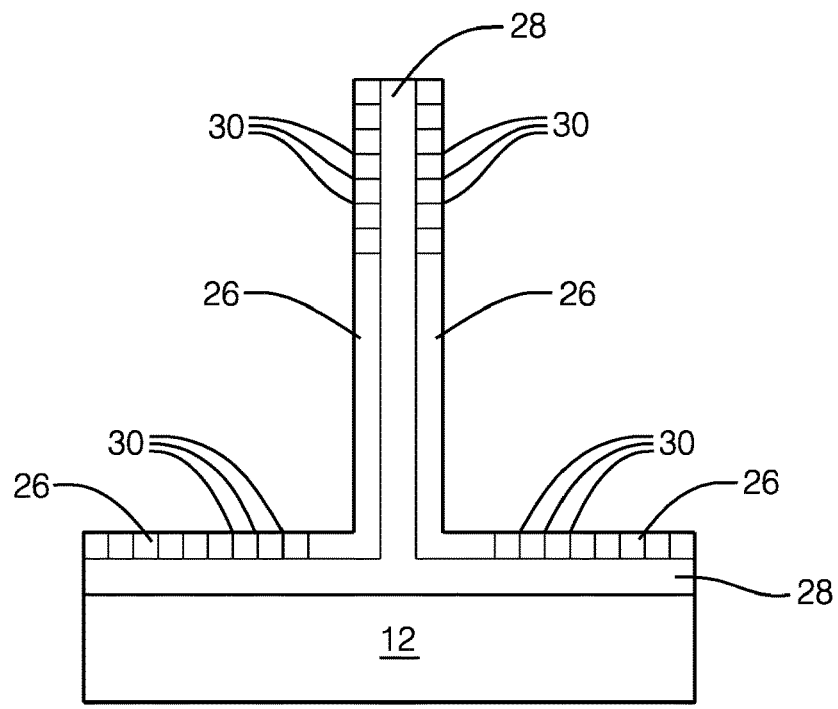
FIG. 3 is a schematic side view of a further embodiment of the heat transfer device.

FIG. 3 shows a further type of heat transfer device 10. The structure is similar to that of the heat transfer device 10 of FIG. 2. The difference being that longitudinal projections 30 are further provided that extend from the metal layers 28 and through each of the layers of graphite 26.

The longitudinal projections 30 are directly connected to the metal layer 28 and are either formed from the same material as the respective metal layer 28 to which they are connected. In the example shown the longitudinal projections 30 are solid cylindrical projections.

Alternatively, the longitudinal projections are formed from a different thermally conducting material that is then bonded to the metal layer, e.g. metal projections 30 could be soldered to the metal layer 28.

Naturally speaking other forms of projections can be employed, also hollow projections could be used. The function of the projections 30 is to increase the conduction of the heat into the respective layer of graphite 26.

The longitudinal projections 30 provided in the layer of graphite 26 of the first plate like structure 22 are arranged distributed over most of the area of the layer of graphite 26.

The longitudinal projections 30 provided in the layers of graphite 26 of the second plate like structure 24 are arranged distributed only over a part of the respective side of the metal layer 28.

Figure 4:
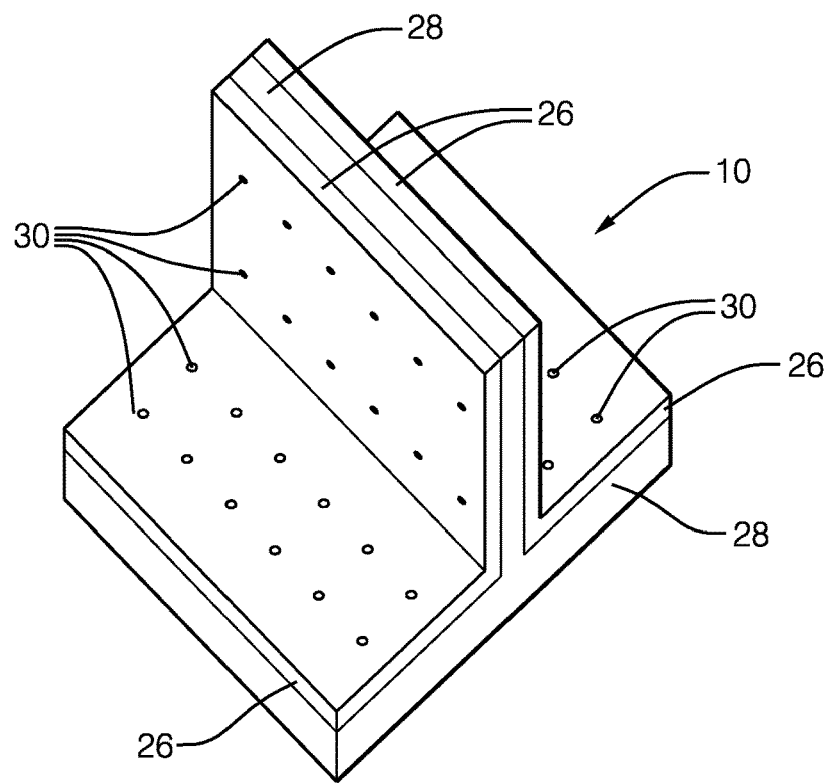
FIG. 4 is a perspective view of the heat transfer device of FIG. 3.

As indicated in both FIGS. 3 and 4 the longitudinal projections 30 project into and through the respective layer of graphite 26 at which they are provided. Naturally speaking they could also project only into or such that they project out of the layer of graphite 26.

As also indicated in FIG. 4 the longitudinal projections 30 can be arranged in a respective array at the respective metal layer 28 and layer of graphite 26. Rows of longitudinal projections 30 of the array are spaced apart at least substantially equal to one another and the longitudinal projections 30 within a respective row are spaced apart at least substantially equal to one another. The spacings between and within rows can naturally vary in dependence on the application.

In order to improve the conductance of heat and to improve the efficiency of heat transfer, the metal layer 28 of the first plate like structure 22 is in direct contact with the metal layer 28 of the second plate like structure 24.

Figure 5:
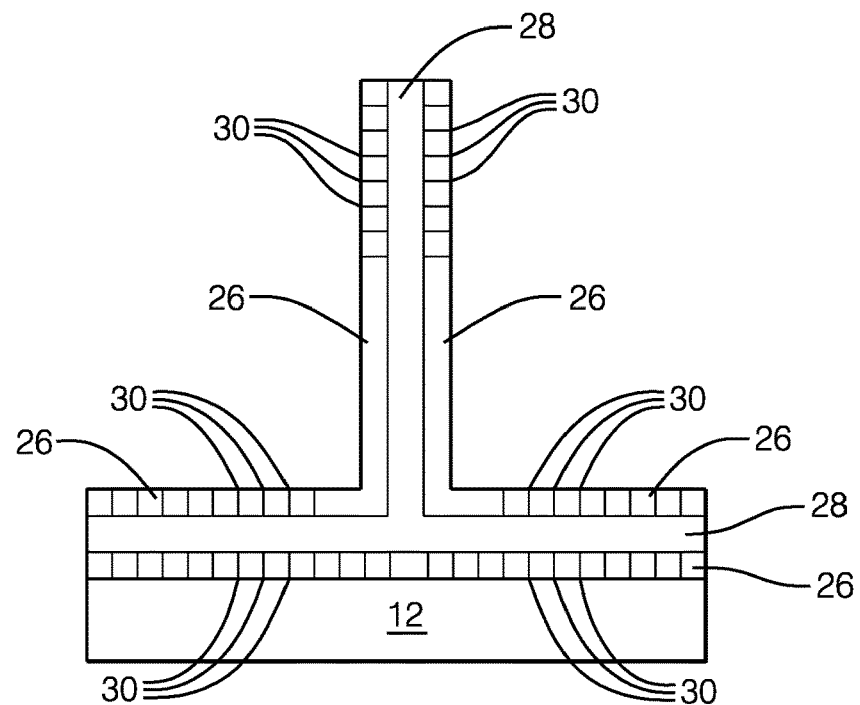
FIG. 5 is a schematic side view of a further embodiment of the heat transfer device.

FIG. 5 shows a further example of the heat transfer device 10. The first plate like structure 22 comprises a triple layer structure similar to that disclosed in connection with the second plate like structure 24 of the heat transfer device 10 of FIGS. 3 and 4.

Thus, both the first plate like structure 22 and the second plate like structure 24 are a multi-layered structure comprising two layers of graphite 26 arranged at either side of the metal layer 28, with longitudinal projections 30 projecting from both sides of the metal layer 28 into and through the respective layer of graphite 26.

The respective longitudinal projections 30 project from oppositely disposed sides of the metal layer 28, with the oppositely disposed sides being the sides of the metal layer 28 having the largest surface area in comparison to the other sides of the respective metal layer 28.

The first plate like structure 22 and the second plate like structure 24 of the heat transfer devices 10 discussed in the foregoing each have a length, a width and a height. By way of example these lengths widths and heights can be selected such that:

A width of the second plate like structure corresponds to at least 70%, preferably at least 80%, most preferably at least 90% and especially to at least substantially 100% of the width of the first plate like structure. In particular, a width of the at least one of the first plate like structure 22 and the second plate like structure 24 can be selected in the range of 3 to 100 mm, preferably in the range of 10 to 50 mm.

A height of the second plate like structure 24 corresponds to at least 70%, preferably at least 80%, most preferably at least 90%, especially to at least substantially 100% and in particular to less than 120% of the height of the first plate like structure 22, in particular a height of the at least one of the first plate like structure 22 and the second plate like structure 24 can be selected in the range of 0.5 to 20 mm, preferably in the range of 0.8 to 10 mm.

A length of the second plate like structure 24 corresponds to at least 70%, preferably at least 80%, most preferably at least 90%, especially to at least substantially 100%, and in particular to less than 150% of the length of the first plate like structure 22, in particular a length of the at least one of the first plate like structure 22 and the second plate like structure 24 can be selected in the range of 3 to 100 mm, preferably in the range of 10 to 50 mm.

A thickness of a respective one of the layers of graphite 26 can be selected in the range of 0.5 to 10 mm, preferably in the range of 0.8 to 5 mm. A thickness of a respective one of the metal layers 28 can be selected in the range of 0.5 to 10 mm, preferably in the range of 0.8 to 5 mm.

A length of the projections 30 typically corresponds to at least 50% of a layer thickness of the layer of graphite 26, in particular to at least 70% of a layer thickness of the layer of graphite 26, preferably to at least 85% of the layer of graphite 26 and especially of at least substantially 100% of the layer of graphite 26. A ratio of height to length of the projections is selected in the range of 1:5 to 100:1, especially in the range of 1:2 to 10:1.

As indicated in the foregoing the second plate like structure 24 is arranged to project from approximately the middle of the first plate like structure 22. Generally speaking, the second plate like structure 24 can be arranged to project from within a range of 40 to 60%, preferably of 45 to 55%, most preferably of 48 to 52%, especially of at least substantially 50% of the length of the first plate like structure 22 and over at least some of the width of the first plate like structure 22.

The heat transfer device 10 discussed herein is a passive heat transfer device 10, such as a heat sink. This means that the heat transfer device 10 does not use e.g. a coolant cycle or the like to bring about the cooling. Further cooling means can be installed at the heat transfer device 10 to further increase a cooling performance thereof.

Figure 6:
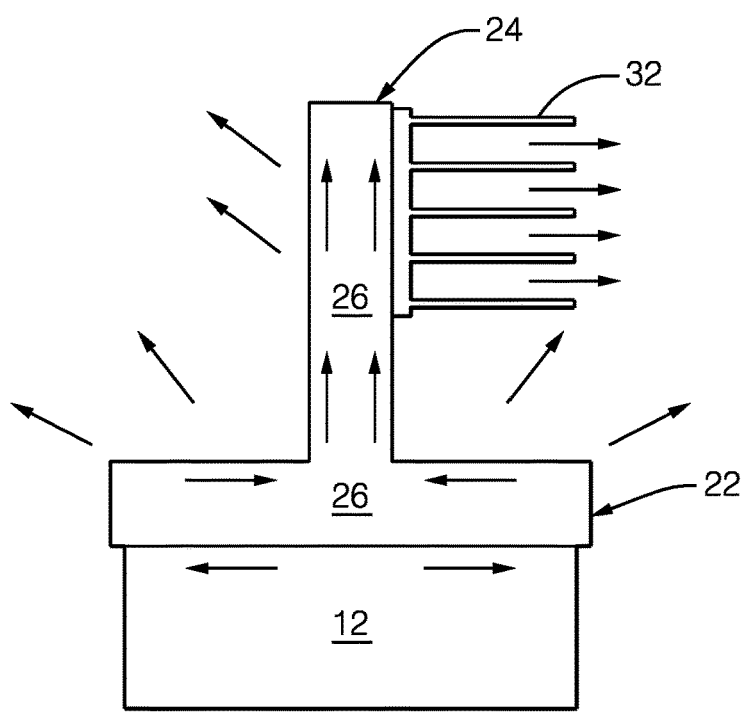
FIG. 6 is a schematic side view of the heat transfer device of FIG. 1 with a radiator installed at the heat transfer device.

FIG. 6 shows a schematic side view of the heat transfer device 10 of FIG. 1 with a radiator 32 installed at the second plate like structure 24 of the heat transfer device 10 as a form of further cooling means.

A second radiator 32 (not shown) could also be installed at the second plate like structure 24. This would then typically be installed at the side of the second plate like structure 24 disposed opposite to the first radiator 32, i.e. the radiators 32 are installed at the sides of the second plate like structure 24 having the largest surface area.

FIG. 6 also shows arrows indicating how the heat from the heat source 12 is transferred from the middle of the heat source 12 to the outside, i.e. to the left and the right, at the side of the layer of graphite 26 of the first plate like structure 22 that is directly adjacent to the heat source 12. The first plate like structure 22 thus acts as a heat spreader spreading the heat uniformly across the outer surface of the heat source 12 to ensure the heat is conducted away from the heat source 12.

The heat in part radiates from the side of the first plate like structure 22 that is remote from the interface between the first plate like structure 22 and the heat source 12 and in part runs from the outside towards the second plate like structure 24. The heat is then directed upwardly and away from the first plate like structure 22 along the second plate like structure 24. The second plate like structure 24 thus acts like a heat pipe by moving heat away in a direction perpendicular to the first plate like structure 22, i.e. vertically in FIG. 6.

On the left-hand side of the second plate like structure 24, the heat is radiated away directly from the second plate like structure 24, whereas on the right-hand side this is radiated away via the radiator 30 to increase the cooling efficiency of the heat transfer device 10.

It should be noted that the one or more radiators 32 discussed in connection with FIG. 6 can also be applied at the respective heat transfer device 10 of FIGS. 2 to 5.

The proposed design of the heat transfer device 10 comprising layers of graphite 26 is capable of improving the heat transfer ratio from the heat source 12 to radiating surfaces 22, 24. This is due to superb, yet unique graphite heat conduction properties, which are the consequence of its layered molecular structure. Graphite conducts heat efficiently along and poorly across the layers. For this reason, it can be described by an orthogonal material model. The conductivity along each layer of an annealed (specially prepared industrial class) graphite reaches $$k_1 = k_2 = 1700 \frac{W}{m-K},$$

while in third, orthogonal direction this value decreases to $$k_3 = 10 \frac{W}{m-K}$$

(see equation 1).

This property can be used to build an efficient thermal vias as discussed in the foregoing for conducting heat out of a device, e.g. the micro controller 16. Schematically, this is presented in FIG. 6.

The problem of limited heat dissipation in a passive cooling system is solved by the proposed technology by means of using specially tailored graphite inserts, mechanically strengthened by a frame made from a heat conductive material. Instead of manufacturing all the housing from highly conductive material like copper alloy $$k_{Cu} = 400 \frac{W}{m-K}),$$

only small graphite inserts can be used to transfer heat out of the device 18. Moreover, possible heat conductivity of an annealed graphite exceeds the corresponding characteristics of copper by more than 4 times. This, in turn, results in even more efficient heat transfer rate from the heat source 12 to the surroundings.

In the examples shown the heat source 12 is covered by a thin layer of graphite 26, with $k_1$ and $k_2$ aligned with a top surface of the heat source 12. In this way, all the heat produced by a source 12 can be spread equally across the available area and partially radiated to the surroundings. The layer of graphite 26 can be attached directly to the heat source 12 or cover a base plate, i.e. the metal layer 28, made from thermally conductive material. However, the main heat transfer is due to the presence of a vertical element comprising graphite, i.e. the second plate like structure 24, with heat conduction aligned in the same direction. This element 24 constitutes a thermal via, which is used to transfer the heat out of the device 18. On the exterior, a heat radiating surface is present at the layer of graphite 26, allowing for heat dissipation to the surrounding air. In order to maintain sufficient stiffness of the structure, the layer of graphite 26 can preferably be attached to a base structure, i.e. the metal layer 28.

In order to strengthen the positive effect of using graphite heat spreader (the first plate like structure 22) on the top of the heat source 12, local thermal vias, i.e. the projections 30 can be used through the thickness of the layer of graphite 26. These thermally conducting support layers 28, in particular formed from a copper or aluminum insert, are bonded to at least one of the layers of graphite 26 of the first and second plate like structures 22, 24 and provide increased out-of-plane conductivity of a graphite pad, allowing for spreading the heat faster in this direction. In a consequence, the pad absorbs and transfers the heat at an increased pace. The same method could be used for transferring the heat from the vertical second plate like structure 24 to the radiator 32, making the whole process even more efficient.

FIG. 5 presents an alternative solution, in which the first plate like structure 22 is covered by layers of graphite 26 from all sides, allowing the heat to flow freely from the source 12 directly to the material of the layer of graphite 26. Similarly as described above, also in this design thermal vias, i.e. projections 30, can be used for better distribution of heat through the thickness of the layer of graphite 26.

While this invention has been described in terms of the preferred embodiments thereof, it is not intended to be so limited, but rather only to the extent set forth in the claims that follow.

We claim:

1. A heat transfer device, the heat transfer device comprising:
    a first plate like structure; and
    a second plate like structure, with the second plate like structure projecting orthogonally from the first plate like structure,
    wherein both the second plate like structure and the first plate like structure each comprise one or more layers of graphite,
    wherein both the first plate like structure and the second plate like structure each comprise a respective thermally conducting support layer,
    wherein the heat transfer device further comprises projections that extend from both of the respective thermally conducting support layers,
    wherein at least some of the projections are arranged in a respective array at both of the respective thermally conducting support layers, and
    wherein at least some of the projections project into the one or more layers of graphite of the first plate like structure and the second plate like structure.

2. A heat transfer device in accordance with claim 1, wherein at least one of the one or more layers of graphite of the first plate like structure is in direct contact with at least one of the one or more layers of graphite of the second plate like structure.

3. A heat transfer device in accordance with claim 1, wherein the thermally conducting support layers are metal.

4. A heat transfer device in accordance with claim 1, wherein the projections are longitudinal projections that extend from both of the thermally conducting support layers, and wherein the projections are directly connected to the respective thermally conducting support layers.

5. A heat transfer device in accordance with claim 1, wherein the projections are formed from a same material as the thermally conducting support layers, and wherein the projections are bonded to the respective thermally conducting support layers.

6. A heat transfer device in accordance with claim 1:
    wherein rows of projections of the array are spaced apart at least substantially equal to one another;
    wherein the projections within a row are spaced apart at least substantially equal to one another; and
    wherein the projections are only arranged over a part of the thermally conducting support layers.

7. A heat transfer device in accordance with claim 1, wherein at least some of the projections are solid cylindrical projections.

8. A heat transfer device in accordance with claim 1, wherein a length of the projections corresponds to at least 100% of a layer thickness of the layer of graphite, and wherein a ratio of height to length of the projections is between 1:2 to 10:1.

9. A heat transfer device in accordance with claim 1, wherein the projections of the thermally conducting support layer of the second plate like structure extend from two sides of the thermally conducting support layer of the second plate like structure,
    wherein the second plate like structure comprises two graphite layers, and
    wherein each of the two graphite layers is disposed on a respective side of the second plate like structure.

10. A heat transfer device in accordance with claim 3, wherein a material of the thermally conducting support layers is a metal and is selected from a group of members consisting of aluminum, copper, silver, gold, aluminum alloys, copper alloys, silver alloys, gold alloys and combinations of two or more of the foregoing, and
    wherein the projections project from oppositely disposed sides of at least one of the thermally conducting support layers, the oppositely disposed sides being sides of the at least one of the thermally conducting support layers having largest surface areas.

11. A heat transfer device in accordance with claim 1,
    wherein a width of the second plate like structure corresponds to at least 100% a width of the first plate like structure,
    wherein a height of the second plate like structure corresponds to at least 70% and less than 120% of a height of the first plate like structure,
    wherein a length of the second plate like structure corresponds to at least 70% and less than 150% of a length of the first plate like structure, and
    wherein the second plate like structure is arranged to project from the first plate like structure within a range of 40% to 60% of the length of the first plate like structure and over at least some of the width of the first plate like structure.

12. A heat transfer device in accordance with claim 1,
    wherein a height of at least one of the first plate like structure and the second plate like structure is between 0.5 and 20 mm,
    wherein a width of at least one of the first plate like structure and the second plate like structure is between 3 and 100 mm,
    wherein a length of at least one of the first plate like structure and the second plate like structure is between 3 and 100 mm,
    wherein a thickness of a respective one of the layers of graphite is between 0.5 and 10 mm, and
    wherein a thickness of a respective one of the thermally conducting support layers between 0.5 and 10 mm.

13. A heat transfer device in accordance with claim 1,
    wherein the heat transfer device is at least substantially T-shaped, at least in a cross-section of the heat transfer device, wherein the first plate like structure forms a horizontal bar of the T-shape and the second plate like structure forms a vertical bar of the T-shape, or
    wherein the heat transfer device is at least substantially L-shaped, at least in a cross-section of the heat transfer device, wherein the first plate like structure forms a horizontal bar of the L-shape and the second plate like structure forms a vertical bar of the L-shape, and
    wherein the first plate like structure is configured to be arranged directly adjacent to a heat source.

14. A heat transfer device in accordance with claim 1, wherein the heat transfer device is a passive heat transfer device, a heat sink, or an automotive heat transfer device that is configured to be used in a vehicle for cooling electronic components of the vehicle, and wherein the heat transfer device further comprises one or more radiators that are arranged at the second plate like structure.

15. A heat transfer device comprising:

a first plate like structure comprising:
- a first portion of a thermally conducting support layer, the first portion of the thermally conducting support layer having a plurality of first projections that extend from at least one side of the first portion of the thermally conducting support layer; and
- a first portion of a layer of graphite disposed on the at least one side of the first portion of the thermally conducting support layer, the first projections extending through the first portion of the layer of graphite; and a second plate like structure projecting orthogonal to the first plate like structure, the second plate like structure comprising:
- a second portion of the thermally conducting support layer, the second portion of the thermally conducting support layer having a plurality of second projections that extend from at least one side of the second portion of the thermally conducting support layer; and
- a second portion of the layer graphite disposed on the at least one side of the second portion of the thermally conducting support layer, the second projections extending through the second portion of the layer of graphite.

16. The heat transfer device of claim 15, wherein the thermally conducting support layer is composed of a metal or a metal alloy.

17. A system comprising:

a housing;

a heat source disposed within the housing; and a heat transfer device disposed within the housing, the heat transfer device comprising:
- a first plate like structure comprising:
  - a bottom surface disposed proximate the heat source;
  - a first portion of a thermally conducting support layer, the first portion of the thermally conducting support layer having a plurality of first projections that extend from at least one side of the first portion of the thermally conducting support layer; and
  - a first portion of a layer of graphite disposed on the at least one side of the first portion of the thermally conducting support layer, the first projections extending through the first portion of the layer of graphite; and
- a second plate like structure projecting orthogonal to the first plate like structure, from a surface opposite the bottom surface, and at least partially through the housing, the second plate like structure comprising;
  - a second portion of the thermally conducting support layer, the second portion of the thermally conducting support layer having a plurality of second projections that extend from at least one side of the second portion of the thermally conducting support layer; and
  - a second portion of the layer of graphite disposed on the at least one side of the second portion of the thermally conducting support layer, the second projections extending through the second portion of the layer of graphite.

18. The system of claim 17, wherein the heat transfer device further comprises one or more radiators disposed on the second plate like structure.

19. The system of claim 17, wherein at least a portion of the second plate like structure extends through the housing.

20. The heat transfer device of claim 1, wherein the second plate like structure is configured to project through a housing.

* * * * *